United States Patent
Chen (10) Patent No.: US 11,830,750 B2
(45) Date of Patent: Nov. 28, 2023

(54) STORAGE APPARATUS, TRANSPORTING DEVICE AND TRANSPORTING METHOD FOR FRONT OPENING UNIFIED POD

(71) Applicant: CHANGXIN MEMORY TECHNOLOGIES, INC., Hefei (CN)

(72) Inventor: Tianzhu Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 73 days.

(21) Appl. No.: 17/515,809

(22) Filed: Nov. 1, 2021

(65) Prior Publication Data

US 2023/0045880 A1 Feb. 16, 2023

Related U.S. Application Data

(63) Continuation of application No. PCT/CN2021/113613, filed on Aug. 19, 2021.

(30) Foreign Application Priority Data

Aug. 11, 2021 (CN) .......................... 202110918563.9

(51) Int. Cl.
*H01L 21/677* (2006.01)
*B65G 1/127* (2006.01)

(52) U.S. Cl.
CPC ........ *H01L 21/67769* (2013.01); *B65G 1/127* (2013.01); *H01L 21/67766* (2013.01); *B65G 2201/0297* (2013.01); *B65G 2203/0283* (2013.01); *B65G 2811/095* (2013.01)

(58) Field of Classification Search
CPC ........ H01L 21/67769; H01L 21/67766; B65G 1/127; B65G 1/1371; B65G 1/045; B65G 1/0457; B65G 1/0464; B65G 2201/0297; B65G 2203/0283; B65G 2811/095; B65G 17/16; B65G 17/32; B65G 17/36; B65G 17/365; B65G 17/48
USPC ..................................................... 414/331.03
See application file for complete search history.

(56) References Cited

U.S. PATENT DOCUMENTS 2,829,780 A * 4/1958 Boor ...................... G09F 11/18
                                                           211/121
3,782,524 A * 1/1974 Fabian ................... B65G 17/12
                                                           198/443
7,165,927 B2   1/2007 Doherty
7,604,448 B2 * 10/2009 Balk ....................... B65G 17/14
                                                           414/331.03

(Continued)

FOREIGN PATENT DOCUMENTS

CN          1662874 A     8/2005
CN        105990200 B     2/2019
(Continued)

*Primary Examiner* — Glenn F Myers
(74) *Attorney, Agent, or Firm* — Cooper Legal Group, LLC (57) ABSTRACT

A storage apparatus, and a transporting device and a transporting method for a Front Opening Unified Pod (FOUP) are provided. The storage apparatus includes: at least two carrying bins configured to carry the FOUP; and a rotating component. The at least two carrying bins are connected to the rotating component at different positions of the rotating component. The rotating component is configured to change positions of the at least two carrying bins through rotation of the rotating component.

15 Claims, 8 Drawing Sheets

(56) References Cited

U.S. PATENT DOCUMENTS

| | | | |
|---|---|---|---|
| 11,335,154 B1* | 5/2022 | Braido | G07F 11/26 |
| 2003/0235486 A1* | 12/2003 | Doherty | B65G 1/0457 |
| | | | 414/217.1 |
| 2004/0101386 A1 | 5/2004 | Robey | |
| 2005/0158152 A1* | 7/2005 | Otaguro | H01L 21/67727 |
| | | | 414/217 |
| 2007/0110547 A1 | 5/2007 | Doherty | |
| 2010/0174405 A1 | 7/2010 | Doherty | |
| 2012/0288348 A1 | 11/2012 | Doherty | |
| 2014/0119857 A1 | 5/2014 | Doherty et al. | |
| 2015/0303087 A1 | 10/2015 | Doherty et al. | |
| 2015/0303088 A1 | 10/2015 | Doherty et al. | |
| 2015/0303089 A1 | 10/2015 | Doherty et al. | |
| 2018/0215534 A1* | 8/2018 | Munholland | B65G 17/485 |
| 2022/0097965 A1* | 3/2022 | Wada | B61B 3/02 |

FOREIGN PATENT DOCUMENTS

| | | |
|---|---|---|
| CN | 209087799 U | 7/2019 |
| CN | 111584358 A | 8/2020 |
| KR | 20130140517 A | 12/2013 |
| KR | 102207874 B1 | 1/2021 |

* cited by examiner

STORAGE APPARATUS, TRANSPORTING DEVICE AND TRANSPORTING METHOD FOR FRONT OPENING UNIFIED POD

CROSS-REFERENCE TO RELATED APPLICATIONS

This is a continuation application of International Patent Application No. PCT/CN2021/113613, filed on Aug. 19, 2021, which claims priority to Chinese Patent Application No. 202110918563.9, filed to the China National Intellectual Property Administration on Aug. 11, 2021 and entitled "STORAGE APPARATUS, TRANSPORTING DEVICE AND TRANSPORTING METHOD FOR FRONT OPENING UNIFIED POD". The disclosures of International Patent Application No. PCT/CN2021/113613 and Chinese Patent Application No. 202110918563.9 are incorporated by reference herein in their entireties.

TECHNICAL FIELD

Embodiments of the disclosure relate to, but are not limited to, a storage apparatus, a transporting device and a transporting method for a Front Opening Unified Pod (FOUP).

BACKGROUND

An Automated Material Handling System (AMHS) is widely used in a large-scale production process of semiconductor products, such as chips and memories. The AMHS includes an Overhead Hoist Transfer (OHT), an Over Head Buffer (OHB), an Under Travel Buffer (UTB), etc., and is configured to store and transport the FOUP. However, large-scale AMHS occupies a relatively large space of a Semiconductor Factory Cleanroom (FAB), and has a low utilization rate.

SUMMARY

Embodiments of the disclosure relate to a storage apparatus, a transporting device and a transporting method for a FOUP.

In a first aspect, an embodiment of the disclosure provides a storage apparatus for a FOUP, which includes:
  at least two carrying bins configured to carry the FOUP; and
  a rotating component, the at least two carrying bins being connected to the rotating component at different positions of the rotating component, and the rotating component being configured to change positions of the at least two carrying bins through rotation of the rotating component.

In a second aspect, an embodiment of the disclosure provides a transporting device for a FOUP. The transporting device includes a storage apparatus, at least one rail, and a transporting component.

The storage apparatus includes: at least two carrying bins configured to carry the FOUP; and a rotating component, the at least two carrying bins being connected to the rotating component at different positions of the rotating component, and the rotating component being configured to change positions of the at least two carrying bins through rotation of the rotating component. The transporting component is configured to move the FOUP into or out of the storage apparatus. The transporting component is located on the rail, and is configured to transport the FOUP by a movement of the transporting component on the rail.

In a third aspect, an embodiment of the disclosure provides a transporting method for a FOUP, which includes the following operations.

A transporting component is moved to a position corresponding to a specified storage apparatus on a rail.

A specified carrying bin among a plurality of carrying bins of the storage apparatus is rotated to a pick and place position of the transporting component through rotation of a rotating component in the storage apparatus. Rotating directions of the rotating component include a first direction and a second direction, and the first direction is opposite to the second direction.

The FOUP is transferred through the transporting component and the specified carrying bin.

BRIEF DESCRIPTION OF THE DRAWINGS

One or more embodiments are exemplarily explained through the figures in accompanying drawings. Unless otherwise specifically declared, the figures in the accompanying drawings do not constitute a limitation of proportion.

DETAILED DESCRIPTION

In order to facilitate understanding of the disclosure, the disclosure will be described more fully hereinafter with reference to the accompanying drawings. Preferred embodiments of the disclosure are illustrated in the accompanying drawings. However, the disclosure may be embodied in many different forms and is not limited to the embodiments described herein. Rather, these embodiments are provided for the purpose of making a disclosure of the disclosure more comprehensive.

Unless defined otherwise, all technical and scientific terms used herein have the same meanings as commonly understood by those skilled in the art to which the disclosure belongs. The terminology used in the specification of the disclosure is for a purpose of describing specific embodiments only and is not intended to limit the disclosure. The term "and/or" used herein includes any and all combinations of one or more of the associated listed items.

Figure 1:
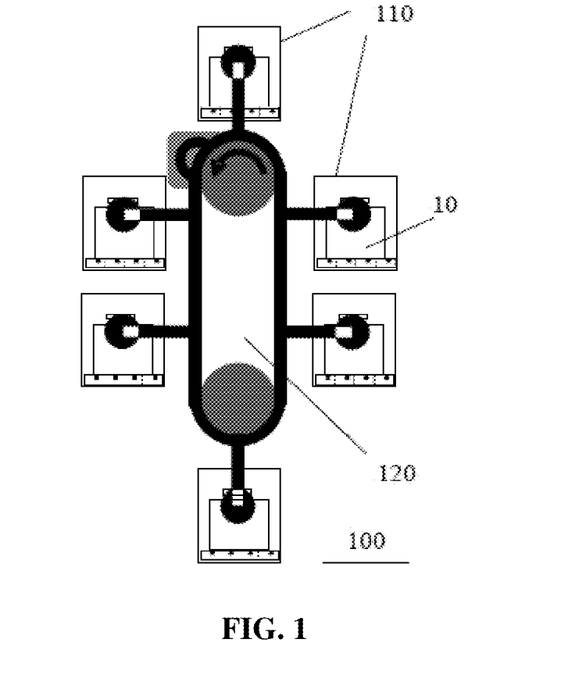
FIG. 1 is a first schematic diagram of a storage apparatus for a FOUP according to an embodiment of the disclosure.

An embodiment of the disclosure provides a storage apparatus for a FOUP. As shown in FIG. 1, the storage apparatus 100 includes:

at least two carrying bins 110 configured to carry the FOUP 10; and a rotating component 120, in which the at least two carrying bins 110 are connected to the rotating component 120 at different positions of the rotating component 120, and the rotating component 120 is configured to change positions of the at least two carrying bins 110 through rotation of the rotating component.

In the embodiment of the disclosure, the FOUP may be a storage box for storing a wafer, for example, a Front Opening Unified Pod, i.e., an FOUP, which is commonly used in a semiconductor factory. The FOUP is a container that may be configured to protect, transport, and store the wafer during manufacture of the semiconductor products, and contains one or more wafers. In the embodiment of the disclosure, the FOUP may be configured to accommodate an original wafer which is not subjected to the semiconductor manufacturing process, and may also be configured to accommodate a wafer which is subjected to part of the semiconductor manufacturing process, i.e., the wafer provided with structures, such as a semiconductor device, on the surface thereof.

The storage apparatus in the embodiment of the disclosure may include a plurality of carrying bins. Each carrying bin is configured to carry the FOUP. It should be noted that the carrying bin here may be a box-shaped bin for accommodating the FOUP, or may also be a platform, a semi-box-shaped element, or a box-shaped bin with an opening on one or more surface thereof capable of carrying the FOUP. A plurality of carrying bins may be connected to the rotating component. The rotating component may drive the carrying bins into rotation synchronously through rotation of the rotating component, so as to change the positions of the carrying bins.

For example, a device for picking and placing the FOUP may be positioned at a fixed position. A target carrying bin may be moved to a position for picking and placing the FOUP through the rotation of the rotating component, which is beneficial for the device for picking and placing the FOUP to pick and place the FOUP.

In this way, one storage apparatus for the FOUP may be connected to a plurality of carrying bins. Compared with a directly tiled arrangement, the space of the FAB can be effectively saved. Further, through rotation, the pick and place speed of the FOUP can be increased, thereby improving the production efficiency.

In some embodiments, the rotating component includes: rotating wheels and a rotating belt arranged around the rotating wheels, in which the rotating wheels are configured to drive the rotating belt into rotation, and the rotating belt is connected to the at least two carrying bins.

The rotating wheels are configured to drive the rotating belt to rotate. The rotating belt is connected to the at least two carrying bins.

The rotating component may be implemented by using the rotating belt and the rotating wheels. The rotating belt is arranged around of the rotating wheels. The rotating belt is connected to a plurality of carrying bins. The rotating belt may rotate under the driving of the rotating wheels, so as to move the carrying bins. The rotating belt may be relatively fixed in position to the rotating wheels by meshing with each other, or by the action of friction. In this way, the carrying bins may be rotated stably or fixed at a specified position.

Figure 2:
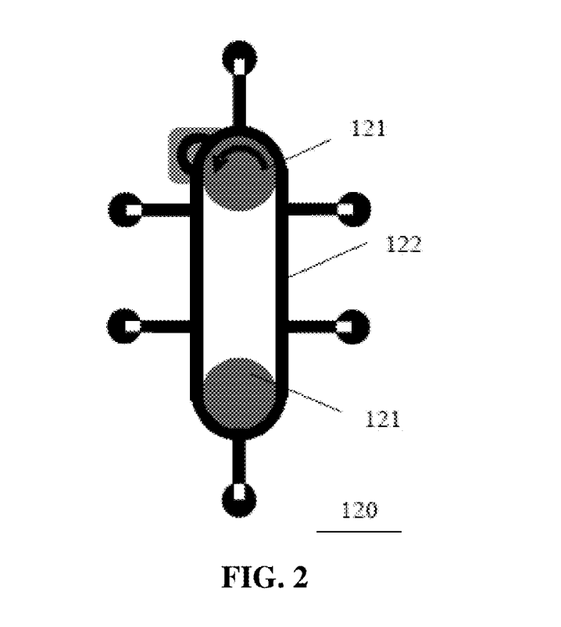
FIG. 2 is a first schematic diagram of a rotating component in a storage apparatus according to an embodiment of the disclosure.

In some embodiments, as shown in FIG. 2, the rotating component 120 includes at least one set of rotating wheels 121. Each set of rotating wheels 121 include two rotating wheels 121 vertically arranged. The rotating belt 122 is a closed annular belt. The rotating belt 122 is arranged around the two rotating wheels 121.

There are two rotating wheels in each set of rotating wheels. The same rotating belt is arranged around the two rotating wheels. In this way, the distance between the two rotating wheels may determine the length of the rotating belt. Therefore, different lengths of the rotating belts may be adopted according to different requirements on the number of the carrying bins. In addition, the rotation direction of the carrying bins is oriented in an arrangement direction of the two rotating wheels, so that the space parallel to the direction of the rotating wheels can be fully utilized.

Figure 3:
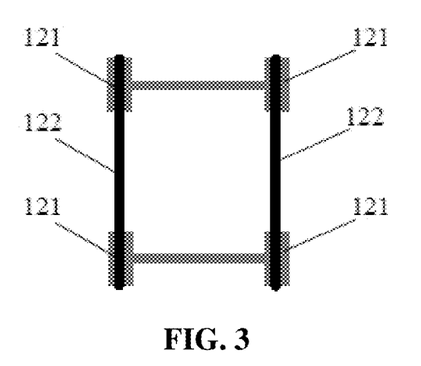
FIG. 3 is second schematic diagram of a rotating component in a storage apparatus according to an embodiment of the disclosure.

In an embodiment, two rotating belts may be respectively arranged around two sets of rotating wheels, and the carrying bins may be connected between the two rotating belts, as shown in FIG. 3, so that the rotation of the carrying bins can be more stable.

Figure 4:
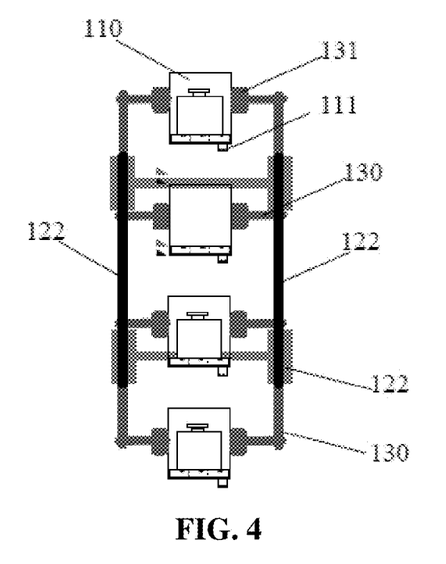
FIG. 4 is a second schematic diagram of a storage apparatus for a FOUP according to an embodiment of the disclosure.

In some embodiments, as shown in FIG. 4, each carrying bin 110 is connected to the rotating belt 122 through a bracket 130, and an attitude control unit 131 is arranged on the bracket 130.

An attitude sensor 111 is provided on a respective one of the carrying bin 110. The attitude sensor 111 is configured to detect angle data of the respective one of the carrying bins 110. The attitude control unit 131 is configured to adjust an angle of the respective one of the carrying bins 110 to be within a predetermined range according to the angle data detected by the attitude sensor 111.

The above-mentioned carrying bin may be connected to the rotating belt through the bracket. Under the driving of the rotating belt, the rotation of the carrying bins will cause the change in the angles of the carrying bins. However, in practical application, it is necessary to maintain the stability of the carrying bins, so as to prevent the FOUP from being damaged due to excessive change in the angles of the carrying bins. Therefore, in the embodiment of the disclosure, an attitude sensor may be provided on each carrying bin to monitor the angle of the carrying bin in real time, and the carrying bin may be adjusted according to the angle of the carrying bin.

In this way, during the rotation of the rotating component, the angles of the carrying bins are always maintained within the predetermined range, so as to maintain a relatively balanced state, thereby reducing damage to the FOUPs due to the change in the angles of the carrying bins.

It should be noted that the angle of the carrying bin may refer to the angle of the extension direction of the bottom surface or the side surface of the carrying bin with respect to the vertical direction or with respect to the horizontal direction.

In some embodiments, the storage apparatus further includes:

a controller connected with the attitude sensor and the attitude control unit for signal interaction, in which the controller is configured to acquire the angle data detected by the attitude sensor, and control the attitude control unit to adjust the angle of the respective one of the carrying bins to be within the predetermined range according the angle data.

The above-mentioned attitude sensor can realize the detection of the angles of the carrying bins through the detection of an optical or mechanical position. The attitude control unit can realize the fine adjustment of the angles of the carrying bins through a miniature electric motor and the like. Since the attitude adjustment of the carrying bins needs to refer to the angle data detected by the attitude sensor, in the embodiment of the disclosure, the angle data of the attitude sensor may be acquired and provided to the attitude control unit by using a controller with a data transmission function. In addition, the controller may also have a data processing function. The acquired angle data is converted into a control signal required by the miniature electric motor, so as to control the miniature electric motor to adjust the angles of the carrying bins.

It should be noted that the controller may be a controller special for adjusting the angles of the carrying bins, or may also be a comprehensive controller for the entire storage apparatus. If the controller is a comprehensive controller, it may also be configured to control the rotation and stop of the storage apparatus, and picking and placing of the FOUP, etc.

Figure 5:
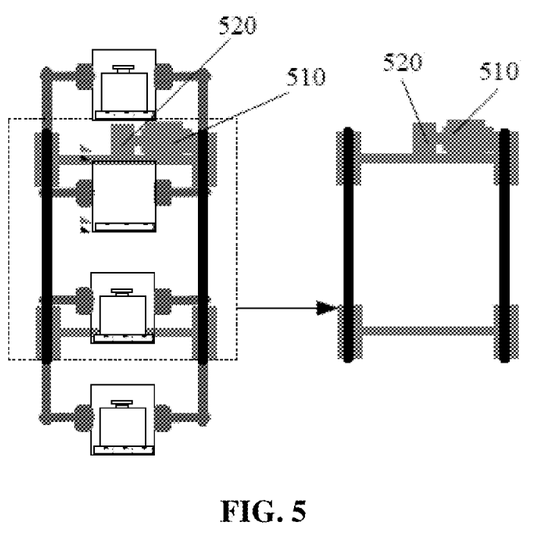
FIG. 5 is a third schematic diagram of a storage apparatus for a FOUP according to an embodiment of the disclosure.

In some embodiments, as shown in FIG. 5, the storage apparatus further includes:

an electric motor 510, in which the electric motor 510 is connected to the rotating wheels 121, and is configured to drive the rotating wheels 121 into rotation; and a speed reducer 520, in which the speed reducer 520 is connected to the electric motor 510, and is configured to control a rotation speed of the electric motor 510.

In the embodiment of the disclosure, the rotation and stop of the storage apparatus may be realized through the electric motor and the speed reducer. The electric motor is connected to the rotating wheels to provide the mechanical kinetic energy required for the rotation of the rotating wheels. The speed reducer is connected to the electric motor. The rotation speed of the rotating wheels is adjusted by adjusting the speed of the electric motor. In this way, it allows the storage apparatus to rotate stably, and the storage apparatus can be stably decelerated and stopped when the storage apparatus needs to be stopped, so as to reduce the damage to the FOUPs and the wafer due to unstable rotation.

In some embodiments, the storage apparatus further includes:

a limit component, in which the limit component is arranged at predetermined position which is fixed relative to the rotating component, and the limit component is configured to stop a respective one of the carrying bins at the predetermined position when the FOUP is picked and placed.

Since the storage apparatus may be cooperated with an external device for picking and placing the FOUP to realize automatic picking and placing of the FOUP, a predetermined position for picking and placing the FOUP may be set. When the carrying bin which needs to perform picking and placing of the wafer, is moved to the predetermined position through the rotation of the rotating component, the carrying bin can be stopped at the predetermined position under the action of the limit component.

The limit component, on the one hand, may be configured to detect whether the carrying bin reaches the predetermined position, and on the other hand, may provide stop signal to the electric motor and the speed reducer which control the storage apparatus to rotate and stop, so that the carrying bin can accurately stop at the predetermined position.

Figure 6:
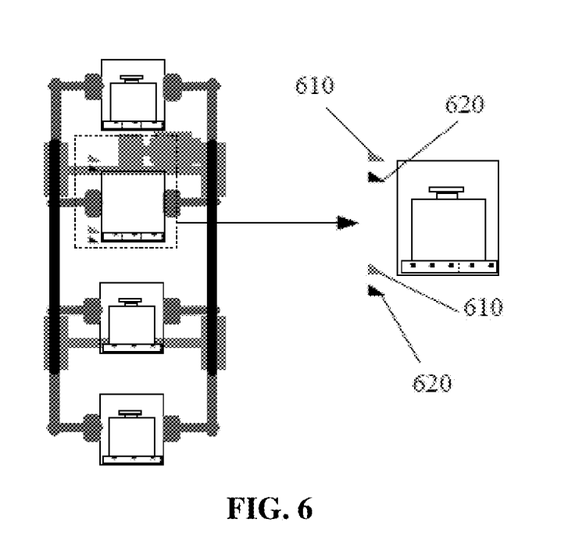
FIG. 6 is a schematic diagram of a limit component in a storage apparatus according to an embodiment of the disclosure.

In some embodiments, as shown in FIG. 6, the limit component 610 includes:

a limit sensor 610 configured to sense whether the respective one of the carrying bin moves to the predetermined position; and a stop unit 620 configured to control the rotating component to stop rotating when the respective one of the carrying bin is detected, by the limit sensor, to be located at the predetermined position.

The above-mentioned limit component may include the limit sensor and the stop unit. The limit sensor is configured to detect the position of the carrying bin. The limit sensor may sense that the carrying bin moves to the predetermined position, and send a corresponding instruction or signal to the stop unit. In this case, the stop unit may further control the carrying bin to stop at the predetermined position.

In some embodiments, the above-mentioned stop unit may also be a sensor. The stop unit and the limit sensor are respectively located at the top portion and the bottom portion of the carrying bin when the carrying bin is stopped at the predetermined position. In this way, when the carrying bin rotates to approach the predetermined position, the carrying bin may be sensed by the limit sensor firstly. After the position of the carrying bin is detected by the limit sensor, the speed reducer can control the carrying bin to decelerate. When the carrying bin moves to a position where it can be detected by the stop unit, the carrying bin may be located at the above-mentioned predetermined position, and at this moment, the carrying bin may be stopped rotating.

In some embodiments, the predetermined position is a pick and place position where the FOUP is picked and placed by a transporting component for picking and placing the FOUP.

In the embodiment of the disclosure, the above-mentioned storage apparatus may be provided with a transporting component. The transporting component is configured to move the FOUP into or out of the storage apparatus. The position where the FOUP is picked and placed by the transporting component corresponds to the above-mentioned predetermined position where the carrying bin is stopped. That is to say, the transporting component only performs picking and placing of the FOUP on the carrying bin which is stopped at the predetermined position. In this way, on the one hand, it facilitates the control of the pick and place process, and on the other hand, it is easy to realize that the pick and place position of the transporting component is fixed.

Figure 7:
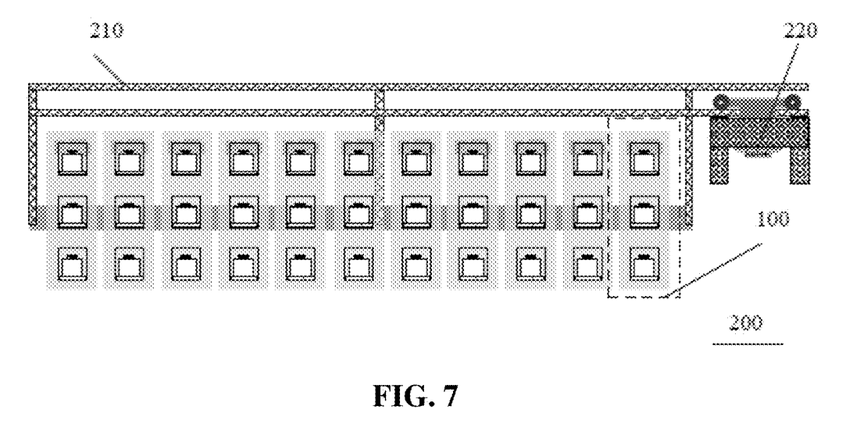
FIG. 7 is schematic diagram of a transporting device for a FOUP according to an embodiment of the disclosure.

As shown in FIG. 7, an embodiment of the disclosure provides a transporting device 200 for a FOUP. The transporting device 200 includes: the storage apparatus 100 described according to any one of the above-mentioned embodiments, a rail 210, and a transporting component 220.

The transporting component 220 is configured to move the FOUP into or out of the storage apparatus 100. The transporting component 220 is located on the rail 210, and is configured to transport the FOUP by a movement of the transporting component on the rail 210.

The rail of the transporting device may be a rail erected at the top portion of the production line or oriented downward in mid-air. The storage apparatus may be hung at a fixed position below the rail or on both sides of the rail. In this way, the space above the production line can be fully utilized, thereby saving the space on the ground.

The transporting component is connected to the rail, and may move on the rail. When the transporting component moves to the predetermined position, the transporting component may perform the pick and place action of the FOUP with the storage apparatus. In this way, the transporting component may flexibly move the FOUP from the storage apparatus to an equipment to be used or other storage apparatuses, and may also move the FOUP from other equipment into the storage apparatus, so as to realize the transporting function of the full automatic production line.

In some embodiments, the transporting device includes a plurality of storage apparatuses. The plurality of storage apparatuses are arranged parallel to the rail.

The transporting device may be provided with a plurality of storage apparatuses. Each storage apparatus is arranged parallel to the rail. In this way, each storage apparatus has a predetermined position for the transporting component to pick and place the FOUP.

In some embodiments, a direction of a rotating axis of the rotating component in the storage apparatus is parallel to an extension direction of the rail.

With such an arrangement, the plurality of carrying bins of each storage apparatus are arranged perpendicular to the rail, while different storage apparatuses are arranged parallel to the rail, so as to realize an arrangement of multiple rows and multiple columns. In this way, on the one hand, the storage capacity of FOUP can be improved, and on the other hand, it facilitates flexible picking and using of the FOUP, thereby improving the efficiency of the production line.

Figure 8:
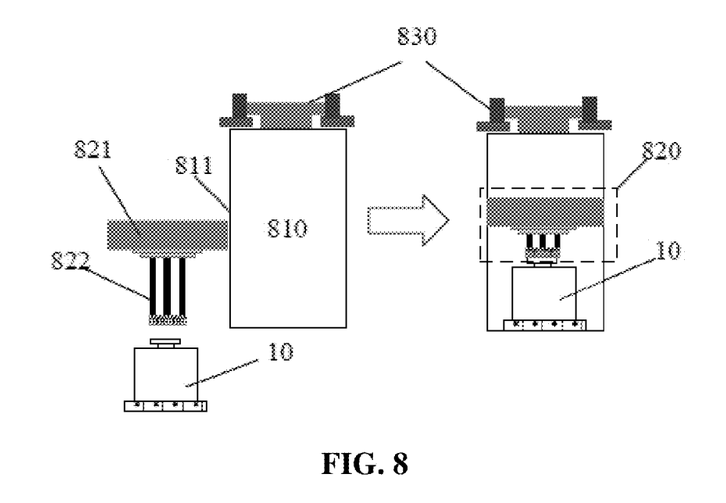
FIG. 8 is a schematic diagram of a transporting component in a transporting device according to an embodiment of the disclosure.

In some embodiments, as shown in FIG. 8, the transporting component includes:
a transporting bin 810 configured to carry and transport the FOUP 10;
a mechanical arm 820 configured to move the FOUP into or out of the transporting bin; and
a slidable component 830 connected to the rail, fixed relative to the transporting bin, and is movable on the rail.

In some embodiments, the transporting bin 810 is arranged below the slidable component 830.

An opening 811 is provided on a side wall of the transporting bin 810, and to move the FOUP into or out of the transporting bin 810 through the opening.

In some embodiments, the mechanical arm 820 is moved out through the opening 811 on the side wall of the transporting bin 810, and is configured to move the FOUP 10 connected thereto into or out of the transporting bin 810.

In some embodiments, the mechanical arm 820 includes:
a moving unit 821 connected to the transporting bin 810 and configured to move out through the opening 811 on the side wall of the transporting bin; and
a retractable unit 822 connected to the moving unit 821 and configured to grab the FOUP 10 in an extended state, in which the moving unit 821 moves into or out through the opening 811 when the retractable unit 822 is in a retracted state.

In some embodiments, a connecting member is provided on the retractable unit, and is configured to connect or disconnect with the FOUP.

In the embodiment of the disclosure, a position sensor may also be provided on the mechanical arm, and is configured to detect the position relationship between the mechanical arm and the carrying bin at the predetermined position on the storage apparatus. When it is detected by the position sensor that the position relationship between the mechanical arm and the carrying bin is the position relationship capable of picking and placing the FOUP, the FOUP can be grabbed or released through the retractable unit, so as to realize picking and placing of the FOUP.

In this way, through the mechanical arm which can move out of the transporting bin and can be extended and retracted on the transporting component, docking with the carrying bin of the storage apparatus can be realized, and the mechanical arm can be separated from the carrying bin after picking and placing are completed and can move to other positions through the rail.

In some embodiments, the transporting device includes two rails parallel to each other.

A plurality of storage apparatuses are arranged in a direction parallel to each of the rails.

The two rails can further improve the transporting efficiency, and increase the storage capacity. Of course, in practical application, the position, length, and number of the rails and the number of the configured storage apparatus may be set flexibly according to the requirements of the actual production line.

Figure 9:
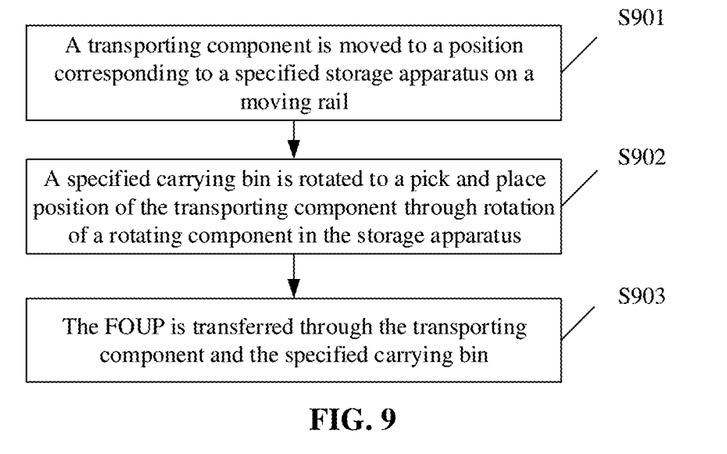
FIG. 9 is a flowchart of a transporting method for a FOUP according to an embodiment of the disclosure.

As shown in FIG. 9, an embodiment of the disclosure provides a transporting method for a FOUP, which includes the following operations.

In S901, a transporting component is moved to a position corresponding to a specified storage apparatus on a rail.

In S902, a specified carrying bin among a plurality of carrying bins of the storage apparatus is rotated to a pick and place position of the transporting component through rotation of a rotating component in the storage apparatus, in which rotation directions of the rotating component include a first direction and a second direction, and the first direction is opposite to the second direction.

In S903, the FOUP is transferred through the transporting component and the specified carrying bin.

In the embodiment of the disclosure, the operation that the FOUP is transported through the transporting device includes that the FOUP is moved into the storage apparatus, and the FOUP is moved out of the storage apparatus and is transported to a target position. Regardless of whether the FOUP is moved in or out, the specified storage apparatus may be predetermined. Since different FOUPs have respective identification information, it is necessary to determine the position into which each FOUP is moved when the FOUP is moved into the storage apparatus. Of course, the carrying bin of each storage apparatus also has a corresponding identification, for example, row/column coordinates, a serial number, or the like.

The transporting component may be moved to a position corresponding to a specified storage apparatus on the rail. The specified carrying bin in the specified storage apparatus may be rotated to the predetermined position of the storage apparatus in advance, so that the FOUP can be picked and placed by the transporting component.

In some embodiments, the operation that the transporting component is moved to the position corresponding to the specified storage apparatus on the rail includes the following operation.

The transporting component carrying the FOUP is moved to the position corresponding to the specified storage apparatus on the rail.

In a process of transporting the FOUP into the storage apparatus, the FOUP may be carried in the transporting component, and is moved to the position corresponding to the storage apparatus through the transporting component. In this case, an empty carrying bin in the storage apparatus may be moved to the predetermined position for picking and placing the FOUP, and then the transporting component may move the FOUP into the carrying bin to complete the storage of the FOUP.

In some embodiments, the operation that the specified carrying bin among the plurality of carrying bins of the storage apparatus is rotated to the pick and place position of the transporting component through the rotation of the rotating component in the storage apparatus includes the following operations.

At least one empty carrying bin in the storage apparatus is detected.

A first time period for each empty carrying bin to rotate to the pick and place position in the first direction and a second time period for each empty carrying bin to rotate to the pick and place position in the second direction are determined.

A rotation direction of the specified carrying bin is determined according to a shorter time period among the first time period and the second time period.

The specified carrying bin is rotated to the pick and place position according to the rotating direction of the specified carrying bin.

The storage apparatus may detect the empty carrying bin in advance. If there are multiple empty carrying bins, the carrying bin closest to the predetermined position may be selected as the carrying bin into which the FOUP is moved.

In addition, the carrying bin is fixed to the rotating component, while the rotating component may rotate in two opposite directions, i.e., the first direction or the second direction. Thus, the selected carrying bin and the rotation direction of the carrying bin may be determined according to the time period required for each empty carrying bin to rotate to the predetermined pick and place position in the first direction or in the second direction respectively.

In this way, the empty carrying bin may be quickly moved to the pick and place position, so as to improve the pick and place efficiency.

In some embodiments, the operation that the FOUP is transferred through the transporting component and the specified carrying bin includes the following operation.

The FOUP carried by the transporting component is moved into the specified carrying bin through the transporting component.

After the plurality of carrying bins in the storage apparatus is stopped rotating, the empty carrying bin is moved to the pick and place position. The transporting component is also moved to the pick and place position and corresponds to the carrying bin. The FOUP is moved out of the transporting bin of the transporting component by the transporting component, and the FOUP is moved into the carrying bin through the retractable mechanical arm.

In this way, the movement of the FOUP into the storage apparatus can be completed.

In some embodiments, the operation that the transporting component is moved to the position corresponding to the specified storage apparatus on the rail includes the following operation.

An empty transporting component is moved to the position corresponding to the specified storage apparatus on the rail.

For moving the FOUP out of the storage apparatus, empty transporting component may be moved on the rail to the position corresponding to the specified storage apparatus from which the FOUP needs to be picked out. Exemplarily, the position corresponding to the above-mentioned specified storage apparatus may be determined according to the information, such as the position coordinates or serial number, of the specified FOUP. Then, the FOUP is moved out through the transporting component, and may be further moved to other equipment.

In some embodiments, the operation that the specified carrying bin among the plurality of carrying bins of the storage apparatus is rotated to the pick and place position of the transporting component through the rotation of the rotating component in the storage apparatus includes the following operations.

A target carrying bin corresponding to a specified FOUP in the storage apparatus is detected.

A third time period for the target carrying bin to rotate to the pick and place position in the first direction and a fourth time period for the target carrying bin to rotate to the pick and place position in the second direction are determined, in which the second direction is opposite to the first direction.

A rotation direction of the target carrying bin is determined according to a shorter time period among the third time period and the fourth time period.

The target carrying bin is rotated to the pick and place position according to the rotating direction of the target carrying bin.

The detection of the target carrying bin of the specified FOUP may be determined by the position information which is recorded when the FOUP is stored. Since each FOUP has its own identification information, when the FOUP is stored, the identification information of each FOUP and the position information of the storage apparatus and the target carrying bin may be recorded.

When the specified FOUP needs to be used, the target carrying bin may be found according to the recorded list.

Herein, the storage apparatus needs to move the target carrying bin to the pick and place position, so that the specified FOUP may be picked out by the transporting device. Therefore, the storage apparatus may determine the rotation direction of the target carrying bin firstly according to the time required for the target carrying bin to move to the pick and place position in different rotation directions. Then, the target carrying bin is rotated to the pick and place position in the rotation direction, so that the specified FOUP can be conveniently moved out of the target carrying bin by the transporting component.

In some embodiments, the operation that the FOUP is transferred through the transporting component and the specified carrying bin includes the following operation.

The specified FOUP is moved out of the target carrying bin through the transporting component.

The method further includes the following operation.

The specified FOUP is transported to a target position by the transporting component on the rail.

The FOUP may be moved out to a target position, including other specified storage apparatuses or other equipment, by the transporting device. Exemplarily, there is equipment which needs to use a wafer in the specified FOUP to perform a semiconductor manufacturing process. In this case, the specified FOUP may be moved out of the storage apparatus and moved into the equipment.

In some embodiments, the operation that the specified carrying bin among the plurality of carrying bins of the storage apparatus is rotated to the pick and place position of the transporting component through the rotation of the rotating component in the storage apparatus includes the following operations.

In a case that the rotating component rotates in the first direction, it is detected, by a first limit sensor, whether a bottom portion of the specified carrying bin reaches the first limit sensor.

Responsive to determining that the bottom portion of the specified carrying bin reaches the first limit sensor, the rotating component continues to rotate in the first direction.

Responsive to detecting, by a first stop unit, that the bottom portion of the specified carrying bin reaches the first stop unit, the rotation of the rotating component is stopped by the first stop unit.

In the embodiment of the disclosure, the storage apparatus is provided with two sets of limit components at the pick and place position. The range of the pick and place position includes the height range of a carrying bin. Each set of limit components includes a limit sensor and a stop unit which are respectively arranged at both ends of the pick and place position, and the distance between the limit sensor and the stop unit is the height of the carrying bin. When the rotating component rotates in the first direction, the first limit sensor and the first stop unit are configured to detect whether the carrying bin reaches the pick and place position, and stop the carrying bin.

Figure 10A:
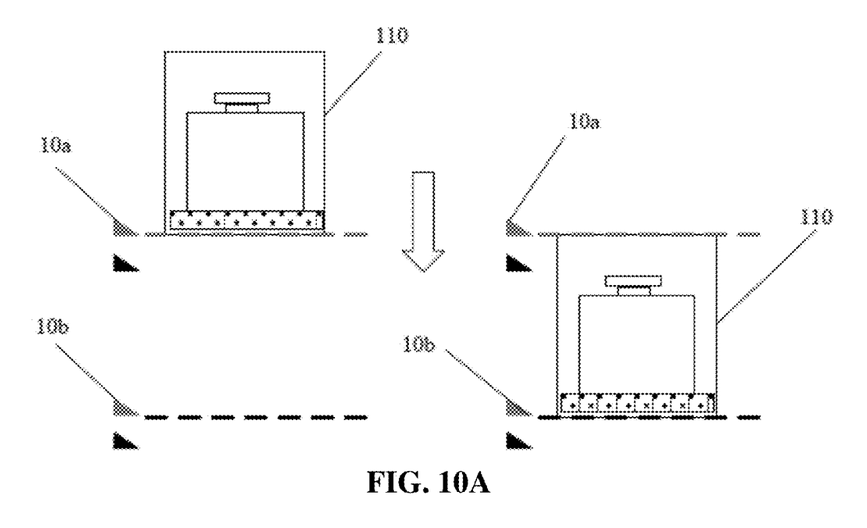
FIG. 10A is a first schematic diagram of a limit component in a storage apparatus according to an embodiment of the disclosure.

As shown in FIG. 10A, when the carrying bin 110 rotates to enter the range of the pick and place position, the bottom portion of the carrying bin 110 firstly enters the topmost part of the range. Therefore, the first limit sensor 10a located in the pick and place range firstly detects that the carrying bin 110 enters the pick and place position. In this case, the rotating component may continuously rotate to move the whole carrying bin into the range of the pick and place position. In this process, the rotating component can be controlled to decelerate. When the bottom portion of the carrying bin 110 reaches the position where the first stop unit 10b is located, the rotating component stops rotating, so that the carrying bin is stopped at the pick and place position. In addition, after the first limit sensor detects that the carrying bin enters the pick and place position, the stopping function of the first stop unit 10b may be activated (for example, for blocking the continuous movement of the carrying bin). In this way, the rotating component may stop rotating once the bottom portion of the carrying bin 110 reaches the first stop unit 10b.

In some embodiments, the operation that the specified carrying bin among the plurality of carrying bins of the storage apparatus is rotated to the pick and place position of the transporting component through the rotation of the rotating component in the storage apparatus includes the following operations.

In a case that the rotating component rotates in the second direction, it is detected, by a second limit sensor, whether a top portion of the specified carrying bin reaches the second limit sensor.

Responsive to determining that the top portion of the specified carrying bin reaches the second limit sensor, the rotating component continues to rotate in the second direction.

Responsive to detecting, by a second stop unit, that the top portion of the specified carrying bin reaches the second stop unit, the rotation of the second stop unit is stopped by the second stop unit.

Figure 10B:
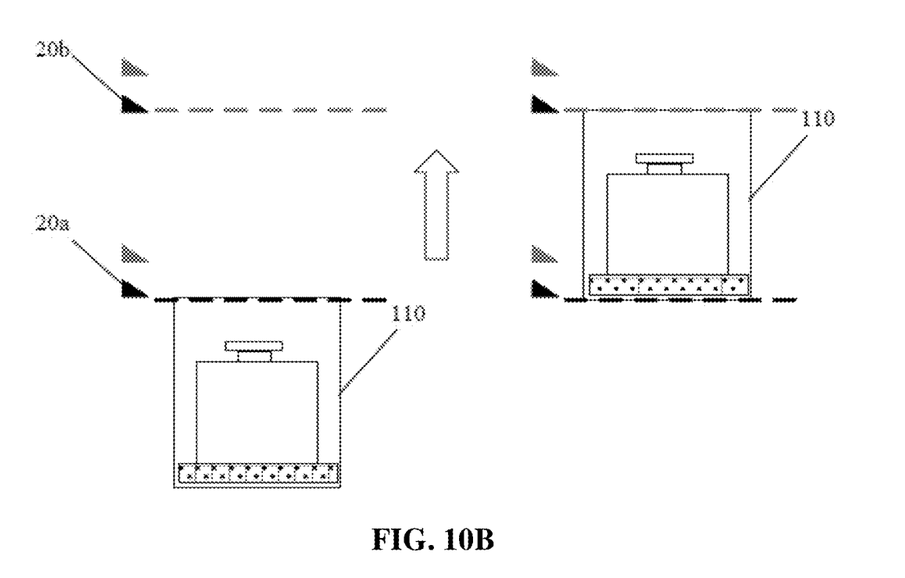
FIG. 10B is a second schematic diagram of a limit component in a storage apparatus according to an embodiment of the disclosure.

The second direction is a rotation direction opposite to the first direction. Therefore, during the rotation of the carrying bin in the second direction, the top portion of the carrying bin enters the pick and place position firstly. Therefore, as shown in FIG. 10B, the second limit sensor 20a is located at the bottom portion of the pick and place position, and the second stop unit 20b is located at the top portion of the pick and place position. Similar to the rotation in the first direction described above, the carrying bin 110 may be accurately stopped at the predetermined pick and place position under the action of the second limit sensor 20a and the second stop unit 20b.

The embodiments of the disclosure further provide the following examples.

Figure 11A:
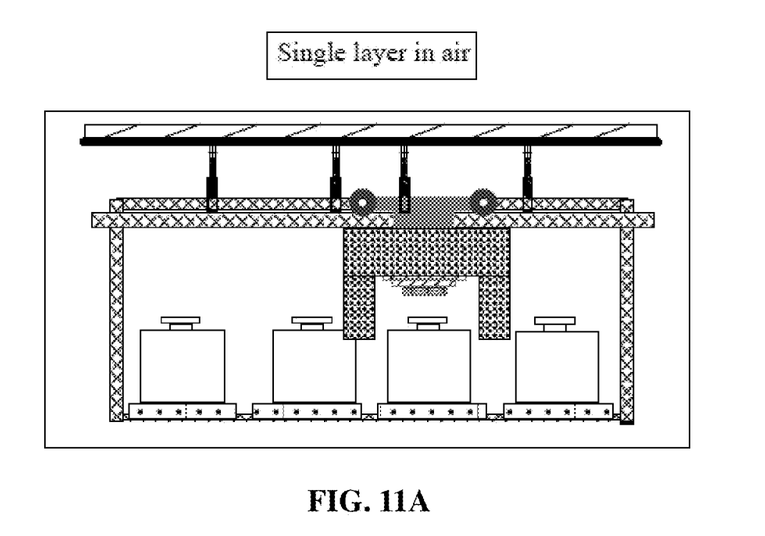
FIG. 11A is a schematic diagram of an AMHS in the form of an aerial single-layer structure in the related art of the disclosure.
Figure 11B:
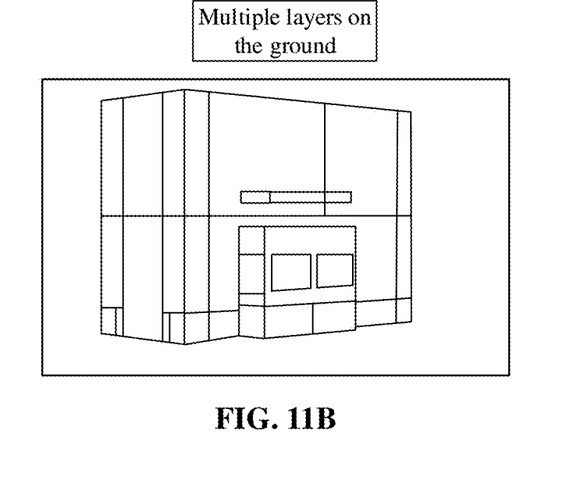
FIG. 11B is a schematic diagram of an AMHS in the form of a ground multi-layer structure in the related art of the disclosure.

An AMHS in the production lines for the semiconductor integrated circuits and other products is generally shown in FIG. 11A and FIG. 11B, including different modes, such as air mode and ground mode.

However, the AMHS in the ground mode occupies the ground space of the FAB, which is not conductive to the reasonable layout of the production line. The AMHS in the air mode has low storage capacity, so that it is still necessary to cooperate with the ground storage apparatus to realize a greater storage capacity, and the transporting is inconvenient, and the efficiency is low.

Therefore, the embodiment of the disclosure provides a transporting device with a multi-dimensional storage space, i.e., AMHS. The device is provided with a plurality of storage apparatuses which may be cyclically lifted and lowered. Each storage apparatus may be arranged adjacent to one another, and is provided with a column of carrying bins for carrying the FOUPs. A plurality of storage apparatuses arranged adjacent to one another may also be arranged in a row, so as to form a two-dimensional storage space with multiple rows and multiple columns. Each carrying bin may be quickly positioned through a row number, a column number, or storage apparatus identification, FOUP identification (FOUP ID), etc., which facilitates the storage and transportation of the FOUP.

Each storage apparatus may rotate, so as to move the carrying bin in which the FOUP is to be picked and placed to a specified pick and place position, i.e., a position corresponding to an OHT. The process of picking out a FOUP (FOUP A) includes the following operation.

Figure 12A:
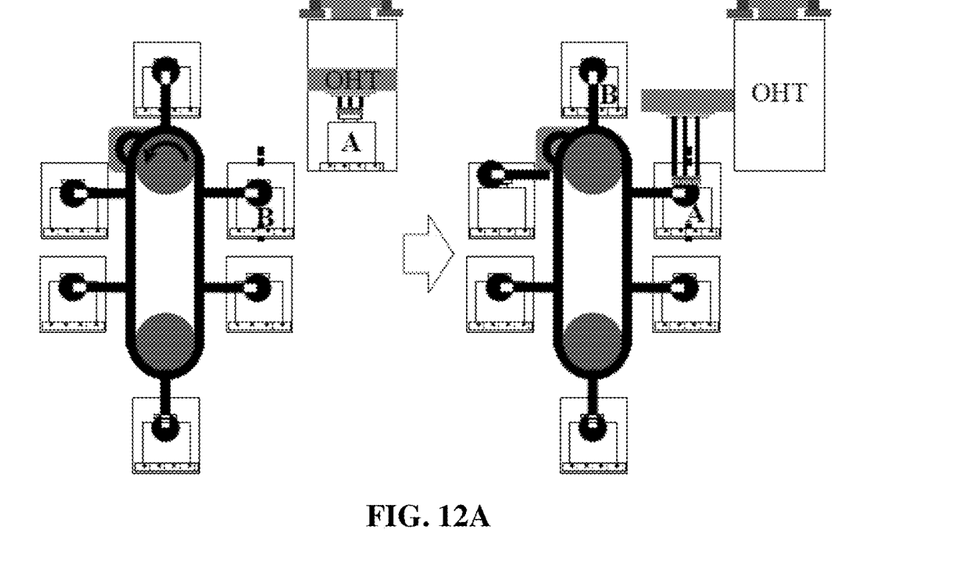
FIG. 12A is a schematic diagram showing a FOUP is placed in a storage apparatus by a transporting device according to an embodiment of the disclosure.

When the OHT needs to use the FOUP A, the system informs the AMHS of the corresponding coordinate information, including the FOUP ID, the row number and column number of the carrying bin for storing the FOUP, etc. As shown in FIG. 12A, the distance for the FOUP A to rotate to the position corresponding to the OHT in the clockwise direction is the shortest. Thus, the storage apparatus may be rotated in the clockwise direction, so that the FOUP A reaches the pick and place position (as shown in FIG. 12A, the FOUP B synchronously rotates to other positions). In this case, the corresponding first limit sensor and the first stop unit control the carrying bin carrying the FOUP A to stop at the pick and place position, so that the OHT can easily grab the FOUP A in the carrying bin.

The process of placing the FOUP A into the storage apparatus includes the following operations.

Figure 12B:
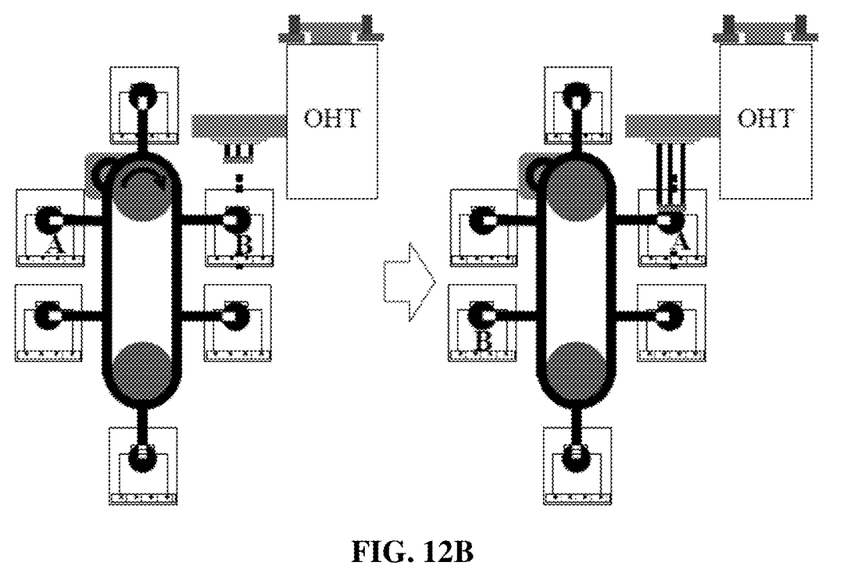
FIG. 12B is a schematic diagram showing a FOUP is picked from a storage apparatus by a transporting device according to an embodiment of the disclosure.

When the OHT needs to place the FOUP A into the storage apparatus, the system informs the AMHS of corresponding information, including the FOUP ID, the row number and column number of the empty carrying bin, etc. The storage apparatus moves the empty carrying bin to the pick and place position. As shown in FIG. 12B, the next carrying bin of the carrying bin where FOUP B is located is an empty carrying bin, and is closest to the pick and place position. Therefore, in this case, the storage apparatus can rotate in the counterclockwise direction to move the empty carrying bin to the pick and place position (the carrying bin for carrying the FOUP B rotates synchronously to the top portion). In this case, the second limit sensor and the second stop unit control the empty carrying bin to stop at the pick and place position, so that the OHT can easily move the FOUP into the carrying bin.

It should be understood that "one embodiment" or "an embodiment" mentioned throughout the specification indicates that a particular feature, structure, or characteristic relating to the embodiment is included in at least one embodiment of the disclosure. Therefore, "in one embodiment" or "in an embodiment" throughout the specification are not necessarily referring to a same embodiment. In addition, these particular features, structures, or characteristics may be combined in one or more embodiments in any appropriate manner. It should be understood that, in the embodiments of the disclosure, sequence numbers of the foregoing processes do not mean execution sequences. The execution sequences of the processes should be determined according to functions and internal logic of the processes, and should not be construed as any limitation on the implementation processes of the embodiments of the disclosure. The sequence numbers of the above-mentioned embodiments of the disclosure are merely for the description, and do not represent the advantages and disadvantages of the embodiments.

It should be noted that in the disclosure, terms "include" and "comprise" or any other variants thereof are intended to cover non-exclusive inclusion, so that a process, a method, an article or a device including a series of elements not only includes those elements, but also includes those that are not explicitly listed, or also include elements inherent to the process, the method or the article, or the device. In a case that there are no more limitations, an element defined by the phase "including a" does not exclude the existence of other same elements in the process, the method, the article, or the device that includes the element.

In the several embodiments provided in the disclosure, it should be understood that the disclosed device and method may be implemented in other manners. The device embodiment described above is merely an example. For example, division into units is merely logical function division, and may be other division in actual implementation. For example, a plurality of units or components may be combined or integrated into another system, or some features may be ignored or may not be performed. In addition, the displayed or discussed mutual coupling or direct coupling or communication connections may be implemented by using some interfaces. The indirect coupling or communication connections between the device or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual requirements to achieve the objectives of the solutions of the embodiments.

In addition, each function unit in each embodiment of the disclosure may be integrated into one processing unit, each unit may also serve as an independent unit, and two or more units may also be integrated into one unit. The integrated unit may be implemented in a hardware form, and may also be implemented in form of hardware and software function unit.

The above are only specific embodiments of the disclosure, but the protection scope of the disclosure is not limited thereto. Any skilled in the art, within the technical scope disclosed by the present disclosure, may easily think of variations or replacements, which should be covered within the protection scope of the present disclosure. Therefore, the protection scope of the disclosure should be subject to the protection scope of the claims.

The invention claimed is:

1. A storage apparatus for a Front Opening Unified Pod (FOUP), comprising:
    at least two carrying bins configured to carry the FOUP; and
    a rotating component, the at least two carrying bins being connected to the rotating component at different positions of the rotating component, and the rotating component being configured to change positions of the at least two carrying bins through rotation of the rotating component,
    wherein the rotating component comprises:
        rotating wheels and a rotating belt arranged around the rotating wheels, wherein the rotating wheels are configured to drive the rotating belt into rotation, and the rotating belt is connected to the at least two carrying bins;
    wherein each carrying bin of the at least two carrying bins is connected to the rotating belt through a bracket, and an attitude control circuit is provided on the bracket; and
    wherein an attitude sensor is provided on a respective one of the at least two carrying bins, the attitude sensor is configured to detect angle data of the respective one of the at least two carrying bins, and the attitude control circuit is configured to adjust an angle of the respective one of the at least two carrying bins to be within a predetermined range according to the angle data detected by the attitude sensor.

2. The storage apparatus of claim 1, wherein the rotating component comprises at least one set of the rotating wheels, each set of the rotating wheels comprises two rotating wheels vertically arranged, the rotating belt is a closed annular belt, and the rotating belt is arranged around the two rotating wheels.

3. The storage apparatus of claim 1, further comprising:
    a controller connected with the attitude sensor and the attitude control circuit for signal interaction, wherein the controller is configured to acquire the angle data detected by the attitude sensor, and control the attitude control circuit to adjust the angle of the respective one of the at least two carrying bins to be within the predetermined range according the angle data.

4. The storage apparatus of claim 2, further comprising:
    an electric motor connected to the rotating wheels and configured to drive the rotating wheels into rotation; and
    a speed reducer connected to the electric motor and configured to control a rotation speed of the electric motor.

5. The storage apparatus of claim 1, further comprising:
    a limit component, wherein the limit component is arranged at a predetermined position which is fixed relative to the rotating component, and the limit component is configured to stop a respective one of the at least two carrying bins at the predetermined position when the FOUP is picked and placed.

6. The storage apparatus of claim 5, wherein the limit component comprises:
    a limit sensor configured to sense whether the respective one of the at least two carrying bins moves to the predetermined position; and
    a stop circuit configured to control the rotating component to stop rotating when the respective one of the at least two carrying bins is detected, by the limit sensor, to be located at the predetermined position.

7. The storage apparatus of claim 5, wherein the predetermined position is a pick and place position where the FOUP is picked and placed by a transporting component for picking and placing the FOUP.

8. A transporting device for a FOUP, comprising the storage apparatus according to claim 1, at least one rail, and a transporting component,
wherein the transporting component is configured to move the FOUP into or out of the storage apparatus, and the transporting component is located on the at least one rail, and is configured to transport the FOUP by a movement of the transporting component on the at least one rail.

9. The transporting device of claim 8, wherein the transporting device comprises a plurality of storage apparatuses arranged parallel to the at least one rail; and
wherein a direction of a rotating axis of the rotating component in the storage apparatus is parallel to an extension direction of the at least one rail.

10. The transporting device of claim 8, wherein the transporting component comprises a transporting bin, a mechanical arm and a slidable component;
the transporting bin is configured to carry and transport the FOUP, the transporting bin is arranged below the slidable component, and an opening is provided on a side wall of the transporting bin to move the FOUP into or out of the transporting bin through the opening;
the mechanical arm is configured to move the FOUP into or out of the transporting bin; and
the slidable component is connected to the at least one rail, is fixed relative to the transporting bin, and is movable on the at least one rail.

11. The transporting device of claim 8, wherein the at least one rail comprises two rails parallel to each other, and
wherein a plurality of storage apparatuses are arranged in a direction parallel to each of the two rails.

12. A transporting method for a Front Opening Unified Pod (FOUP), comprising:
moving a transporting component to a position corresponding to a specified storage apparatus on a rail;
rotating, through rotation of a rotating component in the specified storage apparatus, a specified carrying bin among a plurality of carrying bins of the specified storage apparatus to a pick and place position of the transporting component, wherein rotation directions of the rotating component comprise a first direction and a second direction, and the first direction is opposite to the second direction; and
transferring the FOUP through the transporting component and the specified carrying bin,
wherein moving the transporting component to the position corresponding to the specified storage apparatus on the rail comprises:
moving the transporting component carrying the FOUP to the position corresponding to the specified storage apparatus on the rail,
wherein rotating, through the rotation of the rotating component in the specified storage apparatus, the specified carrying bin among the plurality of carrying bins of the specified storage apparatus to the pick and place position of the transporting component comprises:
detecting at least one empty carrying bin in the specified storage apparatus;
determining a first time period for each empty carrying bin of the at least one empty carrying bin to rotate to the pick and place position in the first direction, and a second time period for each empty carrying bin of the at least one empty carrying bin to rotate to the pick and place position in the second direction;
determining a rotation direction of the specified carrying bin according to a shorter time period among the first time period and the second time period; and
rotating the specified carrying bin to the pick and place position according to the rotation direction of the specified carrying bin,
wherein transferring the FOUP through the transporting component and the specified carrying bin comprises:
moving the FOUP carried by the transporting component into the specified carrying bin through the transporting component.

13. A transporting method for a Front Opening Unified Pod (FOUP), comprising:
moving a transporting component to a position corresponding to a specified storage apparatus on a rail;
rotating, through rotation of a rotating component in the specified storage apparatus, a specified carrying bin among a plurality of carrying bins of the specified storage apparatus to a pick and place position of the transporting component, wherein rotation directions of the rotating component comprise a first direction and a second direction, and the first direction is opposite to the second direction; and
transferring the FOUP through the transporting component and the specified carrying bin,
wherein moving the transporting component to the position corresponding to the specified storage apparatus on the rail comprises:
moving an empty transporting component to the position corresponding to the specified storage apparatus on the rail,
wherein rotating, through the rotation of the rotating component in the specified storage apparatus, the specified carrying bin among the plurality of carrying bins of the specified storage apparatus to the pick and place position of the transporting component comprises:
detecting a target carrying bin corresponding to a specified FOUP in the specified storage apparatus;
determining a third time period for the target carrying bin to rotate to the pick and place position in the first direction, and a fourth time period for the target carrying bin to rotate to the pick and place position in the second direction;
determining a rotation direction of the target carrying bin according to a shorter time period among the third time period and the fourth time period; and
rotating the target carrying bin to the pick and place position according to the rotation direction of the target carrying bin;
wherein transferring the FOUP through the transporting component and the specified carrying bin comprises:
moving the specified FOUP out of the target carrying bin through the transporting component; and
wherein the method further comprises:
transporting, by the transporting component, the specified FOUP to a target position on the rail.

14. The transporting method of claim 12, wherein rotating, through the rotation of the rotating component in the specified storage apparatus, the specified carrying bin among the plurality of carrying bins of the specified storage apparatus to the pick and place position of the transporting component comprises:

in a case that the rotating component rotates in the first direction, detecting, by a first limit sensor, whether a bottom portion of the specified carrying bin reaches the first limit sensor;

responsive to determining that the bottom portion of the specified carrying bin reaches the first limit sensor, continuing the rotation of the rotating component in the first direction; and responsive to detecting, by a first stop circuit, that the bottom portion of the specified carrying bin reaches the first stop circuit, stopping, by the first stop circuit, the rotation of the rotating component.

15. The transporting method of claim 12, wherein rotating, through the rotation of the rotating component in the specified storage apparatus, the specified carrying bin among the plurality of carrying bins of the specified storage apparatus to the pick and place position of the transporting component comprises:

in a case that the rotating component rotates in the second direction, detecting, by a second limit sensor, whether a top portion of the specified carrying bin reaches the second limit sensor;

responsive to determining that the top portion of the specified carrying bin reaches the second limit sensor, continuing the rotation of the rotating component in the second direction; and responsive to detecting, by a second stop circuit, that the top portion of the specified carrying bin reaches the second stop circuit, stopping, by the second stop circuit, the rotation of the rotating component.

* * * * *